United States Patent [19]

Furuyama et al.

[11] Patent Number: 4,676,863
[45] Date of Patent: Jun. 30, 1987

[54] METHOD OF FABRICATING A MESA STRIPE ON A SEMICONDUCTOR WAFER PLANE

[75] Inventors: Hideto Furuyama, Tokyo; Yuzo Hirayama, Yokohama, both of Japan

[73] Assignee: Kabushiki Kaisha Toshiba, Kawasaki, Japan

[21] Appl. No.: 806,497

[22] Filed: Dec. 9, 1985

[30] Foreign Application Priority Data

Jan. 25, 1985 [JP] Japan .................................. 60-12099

[51] Int. Cl.$^4$ ........................................... H01L 21/66
[52] U.S. Cl. .................................... 156/626; 156/647; 156/649; 156/659.1; 156/661.1; 156/662; 29/569 L; 148/DIG. 95
[58] Field of Search ............... 156/626, 647, 649, 652, 156/659.1, 661.1, 662; 29/569 L; 148/DIG. 95

[56] References Cited

U.S. PATENT DOCUMENTS

| | | | |
|---|---|---|---|
| 3,813,585 | 5/1974 | Tarui et al. | 156/647 X |
| 4,099,305 | 7/1978 | Cho et al. | 156/647 |
| 4,171,234 | 10/1979 | Nagata et al. | 156/647 |
| 4,354,898 | 10/1982 | Coldren et al. | 156/647 |
| 4,366,569 | 12/1982 | Hirao et al. | 29/569 L X |
| 4,468,850 | 9/1984 | Liau et al. | 29/569 L |
| 4,595,454 | 6/1986 | Dautremont-Smith et al. | 156/647 |

FOREIGN PATENT DOCUMENTS 56-62386  5/1981  Japan .................................. 29/569 L

OTHER PUBLICATIONS

"Fabrication Characterization and Analysis of Mass-Transported GaInAsP/InP Buried-heterostructure Lasers", IEEE, vol. QE-20, No. 8.855 Aug. 1984.

Primary Examiner—S. Leon Bashore
Assistant Examiner—Andrew J. Anderson
Attorney, Agent, or Firm—Oblon, Fisher, Spivak, McClelland & Maier

[57] ABSTRACT

A method of fabricating a semiconductor crystal mesa stripe whose waist section is narrower than the upper plane of said mesa stripe. The method comprises the steps of forming a first striped mask on the semiconductor crystal wafer in order to fabricate a prescribed mesa stripe, linearly arranging a plurality of second striped masks, narrower than said first striped mask by the prescribed waist width of the main mesa stripe, on the semiconductor wafer plane at prescribed intervals and in parallel with said first striped mask in order to fabricate monitor mesa stripes; and of subjecting said semiconductor wafer plane to mesa etching.

7 Claims, 15 Drawing Figures

F I G. 6A
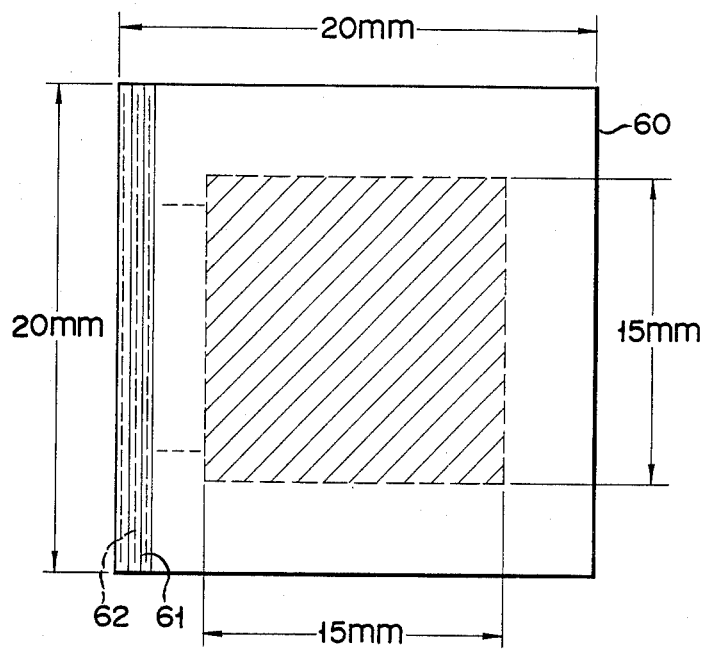
F I G. 6B
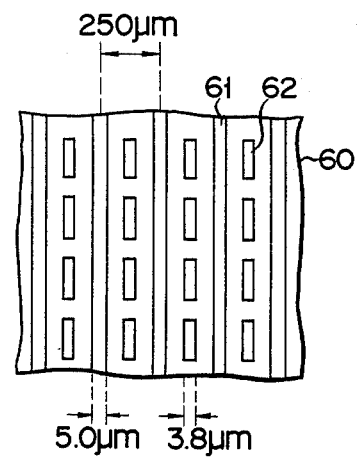

METHOD OF FABRICATING A MESA STRIPE ON A SEMICONDUCTOR WAFER PLANE

BACKGROUND OF THE INVENTION

This invention relates to a method of fabricating a mesa stripe of a semiconductor wafer and, more particularly, to a method of producing an inverted mesa stripe having a waist portion narrower than the upper section of an ordinary mesa stripe; namely, a mesa stripe having an inverted trapezoidal cross section.

Mesa etching is commonly applied to a semiconductor wafer in, for example, manufacturing wave guides of optelectronic device. A semiconductor laser, in particular, needs to have a mesa stripe formed by mesa etching.

FIG. 1 is a schematical, oblique view of an ordinary embedded type semiconductor laser. The laser comprises a semiconductor (crystal) substrate 11, an active layer 12, a cladding layer 13, an ohmic contact layer 14, and embedded PN junctions 15, 16 and 17. The region occupied by active layer 12 is an embedded section. Striped mesa etching is applied to active layer 12 and cladding layer 13. To reduce resistance in the electrode contact, there is formed a so-called inverted mesa stripe, whose upper plane has a width $W_0$ greater than the width $\Delta W$ of the mesa waist section.

The width of embedded active layer 12 noticeably governs the property of the semiconductor laser. It is therefore necessary to control the embedded width of active layer 12 (substantially the waist width $\Delta W$ of the mesa stripe) precisely. However, the width $\Delta W$ of the inverted mesa stripe waist section can not be observed from above. Therefore, a process is employed whereby to observe the waist width $\Delta W$ from the cross section of the vertically cut mesa stripe. Since, however, this process makes it necessary to cut away part of a semiconductor wafer, limitation is imposed on the frequency of observing said waist width $\Delta W$. Consequently, it is difficult to achieve the full observation of said waist width $\Delta W$ and, subsequently, its control.

Recently, a process involving the application of a reference mesa (disclosed in *IEEE Journal of Quantum Electronics*, Vol, QE-20, No. 8, August, 1984, P855) has been proposed for controlling the waist width of the above-mentioned mesa stripe. In this process, a reference mesa stripe (monitor mesa stripe) narrower by a prescribed waist width than the prescribed mesa stripe (main mesa stripe) is arranged parallel with said main mesa stripe, and both the main mesa stripe and said reference mesa stripe are etched. The etching is stopped when the waist width of said reference mesa stripe is reduced to zero, namely, when said reference mesa stripe is cut off. Thus is produced a main mesa stripe having a prescribed waist width. This process has the merit of allowing one to determine whether the main mesa stripe has attained the desired waist width, simply by permitting observation of the main mesa stripe from above without the need to cut away part of the semiconductor wafer.

However, the above-mentioned proposed process is accompanied with the undermentioned drawbacks. The monitor mesa stripe extends from end to end of the semiconductor wafer plane. To cut off the monitor mesa stripe, therefore, etching has to be continued until the entire waist width of the monitor mesa stripe is reduced to zero. The different portions of the monitor mesa stripe are etched at different speeds. The center portion of the monitor mesa stripe may fail to have its waist width reduced to zero due to the irregular etching. If this happens, the monitor mesa stripe is not removed, and observation of the waist width of the corresponding main mesa stripe is obstructed. Further when the monitor mesa stripe happens to break, the waist width of the main mesa stripe can reach a prescribed width in the region where etching proceeds most slowly, but becomes narrower than the prescribed width in regions where etching is carried out faster. Further it is impossible to detect that region of the main mesa stripe whose waist width has reached a prescribed level. Therefore, the process disclosed in *IEEE Journal of Quantum Electronics* also presents difficulties in providing a mesa stripe having a desired waist width for the whole of its length. The above-mentioned problems are most noticeable when the etching solution is stirred.

SUMMARY OF THE INVENTION

It is, accordingly, the object of this invention to provide a method of fabricating the mesa stripes on a semiconductor wafer plane which enables monitor points (waist width observing points) on the semiconductor wafer to be promptly increased in number when said semiconductor wafer is subjected to mesa etching, makes it possible to observe the waist width of the mesa stripe even when etching is carried out irregularly at various monitor points, and ensures accurate control of the waist width of the main mesa stripe.

The object of this invention is attained by the following process. A first striped mask is set on the surface of a semiconductor (crystal) substrate to form a main mesa stripe. A second striped mask is provided on said surface in parallel with said first striped mask in order to fabricate a monitor mesa stripe which is narrower than the first striped mask by the prescribed waist width of the main mesa stripe. The method of this invention for the fabricating of a mesa stripe on the semiconductor crystal plane by mesa etching is characterized in that a plurality of the above-mentioned second striped masks for the formation of monitor mesa stripes are linearly arranged at a prescribed interval. This being the case, it will be noted that the separate monitor mesa stripes are cut off from the semiconductor substrate when mesa etching is carried out to the full extent. At this point in time, therefore, it is possible to determine the prescribed waist width of the corresponding main mesa stripe.

Thus, the present invention offers the advantages that the waist width of the main mesa stripe, can be accurately controlled, a factor playing a prominent role in the manufacture of an embedded type semiconductor laser. Even when the prescribed mesa stripes are etched at different rates at the various surface regions of the semiconductor wafer plane, the plural monitor stripes, arranged separately and in parallel with the prescribed mesa stripes, can individually indicate the current etched condition of the corresponding partions of the main mesa stripe, making it possible to detect the distribution of the waist widths of the portions of the main mesa stripe formed on the semiconductor wafer plan; namely, to monitor the distribution of the etched conditions of the portions of the main mesa stripes formed on the semiconductor wafer plane.

BRIEF DESCRIPTION OF THE DRAWINGS

FIGS. 6A and 6B are plan views setting forth the etching masks arranged on one chip;

DETAILED DESCRIPTION OF THE PREFERRED EMBODIMENTS

Figure 1:
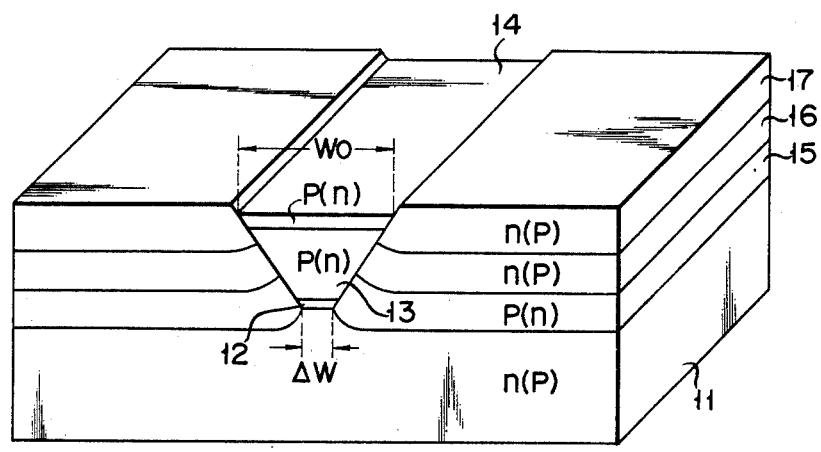
FIG. 1 is an oblique view schematically indicating the structure of the ordinary embedded type semiconductor laser.
Figure 2A:
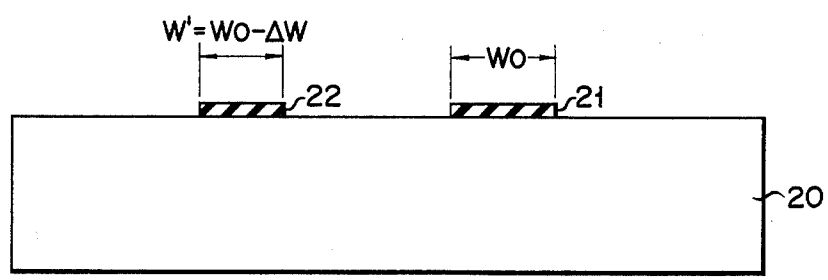
FIGS. 2A to 2C are sectional views illustrating the principle of this invention.
Figure 2B:
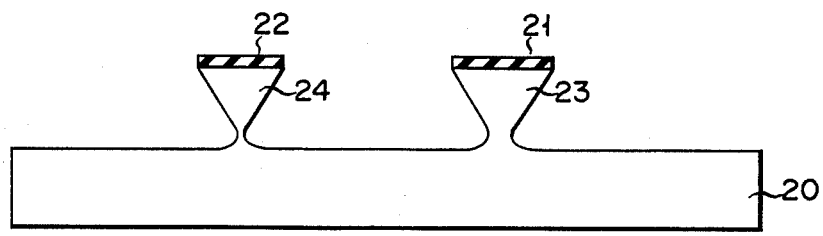
Figure 2C:
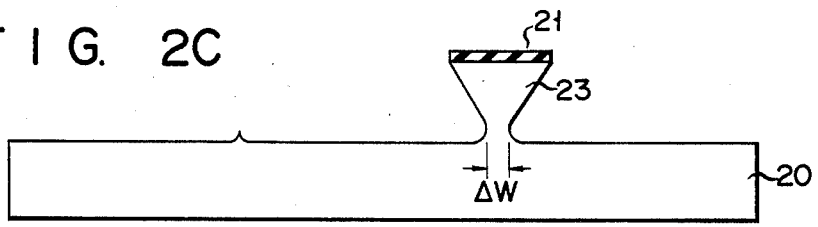

Prior to an explanation of the preferred embodiments, description will be made of the fundamental principle on which the present invention is based. FIGS. 2A to 2C are sectional views illustrating the basic principle of this invention. As shown in FIG. 2A, a first striped mask 21 having a width $W_0$ is formed on a semiconductor (crystal) substrate 20 in preparation for the formation of a prescribed mesa stripe. At this time, a second striped mask 22, whose width W' is formed so as to be narrower than the first striped mask by the prescribed waist width $\Delta W$ ($W' = W_0 - \Delta W$). Then, etching is carried out in the inverted mesa shape (FIG. 2B), providing mesa stripes 23, 24. It is seen in this case that, so long as the mesa etching is carried out in a similar pattern, the difference in the mesa width at the identical depth of both stripes 23, 24 is represented by $\Delta W$. When etching advance further, the monitoring mesa stripe 24 has its waist width reduced to zero. As shown in FIG. 2C, the monitoring mesa stripe 24 consequently breaks off. At this point, the waist width of the mesa stripe 23 is indicated by $\Delta W$.

The above-mentioned process makes it possible to determine whether the waist width of the mesa stripe has reached a prescribed level, simply by observation of the surface of the mesa stripe and without cutting off part of the semiconductor wafer 20. In the event, however, irregularities occur in the etching previously described, it is impossible to ensure observation of the waist width of the mesa stripe.

When the etchant is stirred, as will be discussed below, the above-mentioned problem becomes more noticeable. A semiconductor crystal prepared from, for example, InP or GaAs, can readily assume the inverted mesa pattern when etched by a solution of Br methanol. However, a Br methanol solution carries out etching at widely varying rates, depending on the Br concentration. For this reason, it is necessary to stir the Br methanol solution once in a while in order to unify the Br concentration in said solution. The drawback occurring in this case is that etching tends to proceed with a greater depth in the direction in which the etchant flows; that is, toward the end of the semiconductor wafer, and with a lesser depth toward the center of said semiconductor wafer. This event arises from the fact that Br tends to have different concentrations at the end and central portions of said semiconductor wafer plane. This variation in the Br concentration results from the different flow rates of the etchant over the surface of the semiconductor wafer, and the vortical condition of the etchant at the end of said substrate. Now, let it be assumed that the wafer thickness d is represented by an approximation formula:

$$d = do - A\sqrt{1/X}$$

Figure 3A:
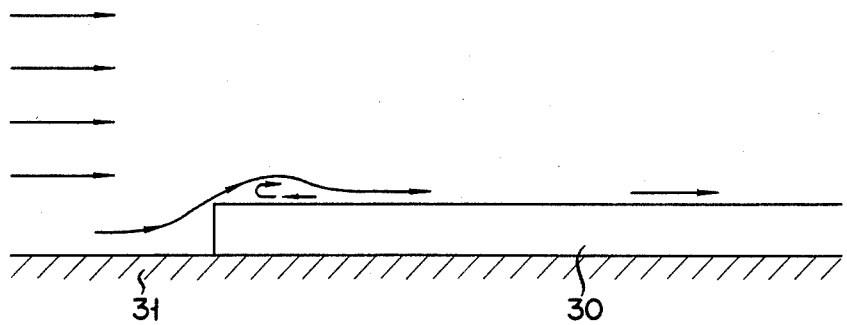
FIG. 3A is a schematic view illustrating a flow of etchant.
Figure 3B:
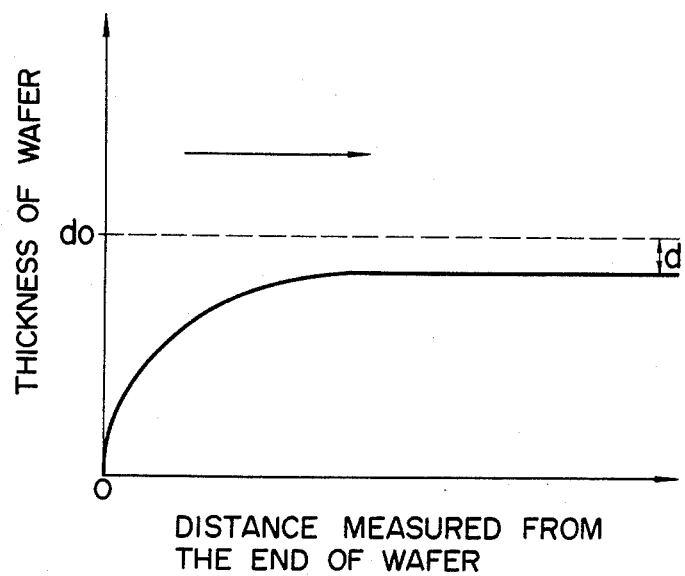
FIG. 3B is a graph illustrating the changes in the etching property which result from the stirring of an etchant.

It is seen that the etching rate varies within a distance X measured from the end of the wafer. In the above formula, character A denotes a time function defined by the concentration, flow rate of the etchant, etc. FIGS. 3A and 3B, respectively, illustrate the etching condition and etching profile. Referring to FIG. 3A, reference numeral 30 represents a semiconductor wafer, and reference numeral 31 denotes a wafer holder.

With the above-described etching process, wherein the etchant is sometimes subjected to stirring, etching takes place with different depths at the central and end portions of the semiconductor wafer, making it impossible to observe the waist width of a mesa stripe except at the central portion. To eliminate this drawback, this invention is characterized in that a plurality of monitor mesa stripes are arranged intermittently so as to increase the number of monitoring points on the semiconductor wafer plane when mesa etching is applied thereto.

Figure 4A:
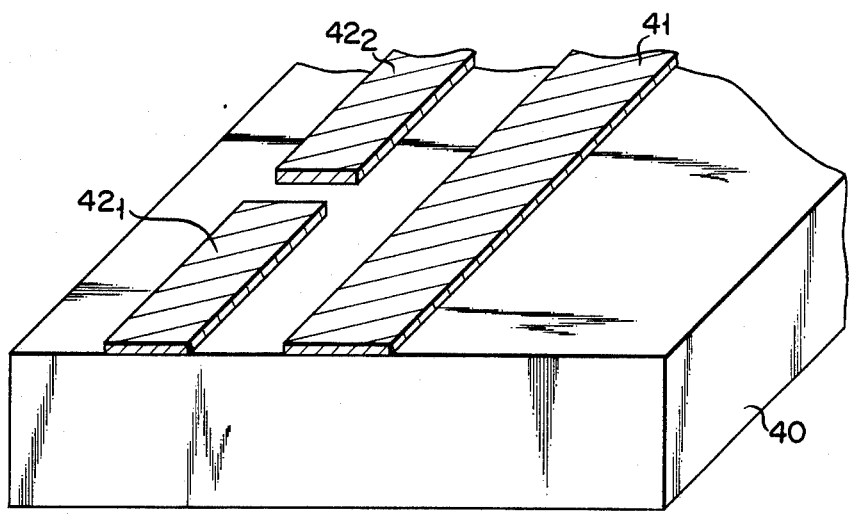
FIGS. 4A and 4B are oblique views indicating the steps of fabricating a mesa stripe by a method according to a first embodiment of this invention.
Figure 4B:
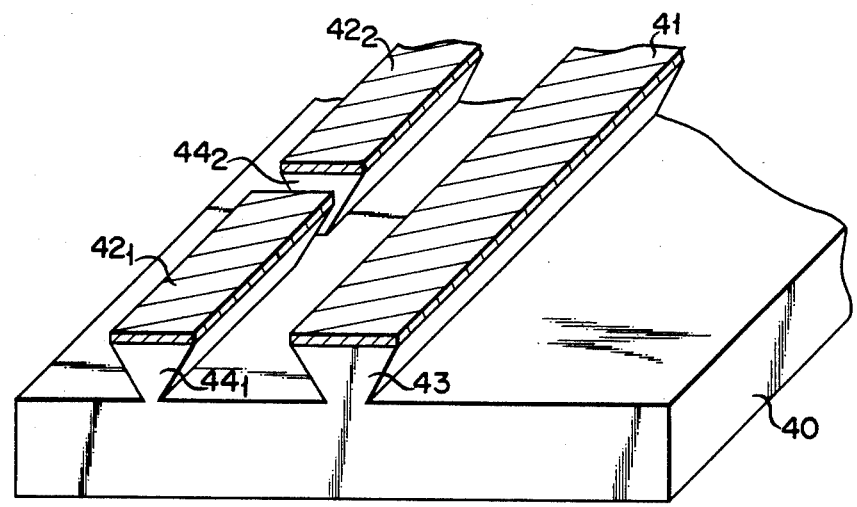

Detailed description may now be made, with reference to the accompanying drawings, of this invention's method for fabricating a mesa stripe on a semiconductor wafer. FIGS. 4A and 4B are oblique views illustrating the sequantial steps of fabricating a mesa stripe on a semiconductor wafer by a method according to a first embodiment of this invention. As shown in FIG. 4A, a first striped mask 41 is set on the semiconductor wafer 40 in order to fabricate the main mesa stripe. Further, a plurality of second striped masks $42_1$, $42_2$, ... are set on said semiconductor wafer 40 in order to fabricate monitor mesa stripes which are narrower than said first striped mask by the prescribed waist width of the main mesa stripe. The second striped masks $42_1$, $42_2$, ... are linearly arranged at proper intervals in parallel with the first striped mask 41.

When the semiconductor wafer 40 is etched by the prescribed etchant, the main mesa stripe 43 and monitor mesa stripes $44_1$, $44_2$, ... are formed as shown in FIG. 4B. When etching is advanced further, the waist width of the respective monitor mesa stripes $44_1$, $44_2$, ... is reduced to zero. In this case, the reductions to zero of the waist width of the respective monitor mesa stripes $44_1$, $44_2$ need not be completed at the same point in time. Namely, the elimination of the waist widths of the respective monitor mesa stripes $44_1$, $44_2$, ... are effected at different points in time depending on the rate of the etching occurring at the linearly arranged monitor mesa stripes $44_1$, $44_2$, ..., thus making it possible to externally detect the etching rates at the positions of the respective monitor mesa stripes $44_1$, $44_2$, .... When, therefore, the period of time extending from the point in time at which etching of the waist width of the monitor mesa stripe $44_1$, $44_2$, ... is commenced, to the point in time at which said waist width is reduced to zero-when the monitor mesa stripe $44_1$, $44_2$, ... is cut off from the surface of the semiconductor wafer-is measured, it is possible to gain an awareness of both the various etching rates of the etchant throughout the surface of the semiconductor wafer, and of the distribution of the etching rates of the waist width of the main mesa stripe at the respective positions, allowing one to estimate the yield of the subject main mesa stripe 43 resulting from the effect of etching.

Description may now be made of the materials used in the fabrication of a mesa stripe according to the method of this invention. Now, let it be assumed that the semiconductor wafer 40 is prepared from a semiconductor composed of a compound belonging to Groups III-V of the periodic table; for example, InP, or GaAs. Then the first and second striped masks 41, $42_1$, $42_2$, . . . are provided in the plane (001) of the semiconductor wafer 40 so as to extend in the direction of <110>. When an etchant prepared from, for example, Br methanol is applied, a main mesa stripe 43 and a plurality of monitor mesa stripes $44_1$, $44_2$, . . . are formed as shown in FIG. 4B. In this case, it is preferred that both first and second striped masks be formed of a silicon oxide film such as $SiO_2$, or a silicon nitride film such as $Si_3N_4$.

Figure 5:
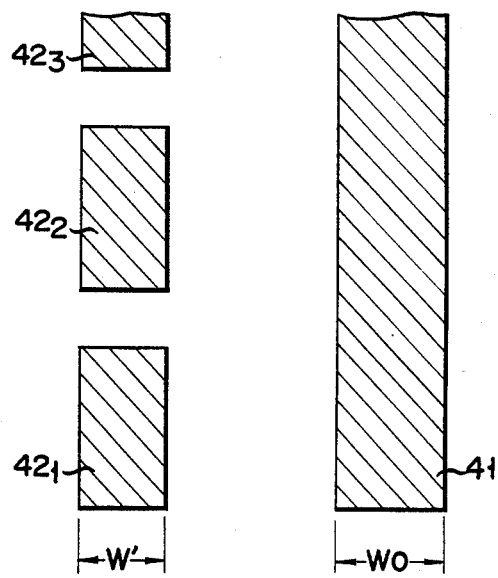
FIG. 5 is a plan view showing the arrangement of etching masks.

FIG. 5 is the top view of mesa etching masks arranged in accordance with the mesa stripe fabricating method of this invention. Now, let it be assumed that $W_0$ represents the width of the first striped mask 41, and that $\Delta W$ denotes the waist width of the main mesa stripe. Then, the width W' of the second striped mask $42_1$ is expressed as $$W' = W_0 - \Delta W$$

If a plurality of second striped masks $42_1$, $42_2$, . . . linearly arranged at a prescribed interval, each have a length 2 to 3 times longer than the width W' of the respective striped masks $42_1$, $42_2$, . . . the same effect can be attained as in the conventional case where a single monitor stripe extends along the whole length of the semiconductor wafer. Further, it is advised to select the interval between the respective linearly arranged second striped masks in accordance with the depth of the intended mesa etching; for instance, to define said interval to be more than twice said etching depth.

Since the mesa stripe fabricating method of this invention is characterized in that a plurality of second striped masks are linearly arranged at a prescribed interval, separate monitor mesa stripes are provided, thereby providing a far larger number of monitoring points than in the conventional stripe-fabricating method. Consequently, it is possible both to improve the mesa etching rate, and to determine the distribution of the waist widths of the main mesa stripe at various points on the semiconductor crystal substrate.

Description may now be made of an experiment of determining the distribution of the waist widths of the main mesa stripe at various points on the semiconductor wafer plane. As shown in FIG. 6A, the present inventors formed both the plural lines of first striped masks 61 on a semiconductor chip 60 measuring 20 mm×20 mm in order to fabricate main mesa stripes, and, further, a plurality of second striped masks 62, linearly extending at prescribed interval between the respective lines of said first striped masks 61, in order to fabricate monitor mesa stripes. As shown in FIG. 6B (an enlargement of FIG. 6A), the width $W_0$ of the first striped masks 61 was defined at 5.0 microns. The width W' of the second striped mask 62 was defined as follows $$W' = W_0 - \Delta W = 3.8 \text{ microns,}$$

where the desired waist width $\Delta W$ of the main stripe was set at 1.2 microns. The plural first striped masks 61 were separated from each other by an interval of 250 microns.

The above-mentioned main stripes and monitor stripes were etched by the previously described Br methanol solution. First, main and monitor mesa stripes were formed. Later, monitor mesa stripes around the peripheral edges of the chip 60 began to break. In a region about 2.5 mm inside of the peripheral edge of the chip 60, the monitor mesa stripes broke at widely different points in time. At the central portion of the chip 60 (a hatched square region measuring about 15 mm on each side, shown in FIG. 6A), the monitor mesa stripes broke at substantially the same point in time. This clearly shows that the waist widths of the main mesa stripes lying in the central portion of the chip 60 were uniformly controlled at a prescribed width. If, therefore, a semiconductor laser is fabricated from only the central portion of the chip 60, a noticeable improvement can be expected in the yield.

Figure 7A:
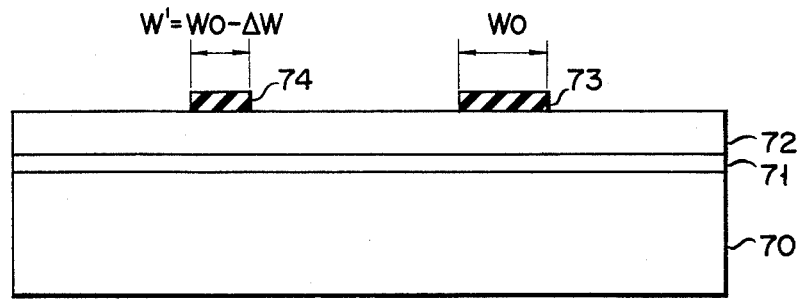
FIGS. 7A to 7D are sectional views showing the sequential steps of fabricating a mesa stripe by a method according to another embodiment of the invention.

Description may now be made, with reference to FIGS. 7A to 7D, of a main mesa stripe-fabricating method according to another embodiment of this invention. In with this second embodiment, the striped masks were prepared from $SiO_2$, $Si_3N_4$ and a semiconductor compound InP. First, as shown in FIG. 7A, a layer 71 of GaInAsP and a layer 72 of InP were grown on the substrate 70 of InP in the order mentioned. Then, a first striped mask 73 and second striped masks 74 resembling the aforesaid striped masks 41, $42_1$, $42_2$ . . . were deposited on the InP layer 72. The striped masks 73, 74 were allowed to have the same widths as those of the aforementioned striped masks 41, $42_1$, $42_2$, . . . The second striped masks 74 were linearly arranged at prescribed intervals.

Figure 7B:
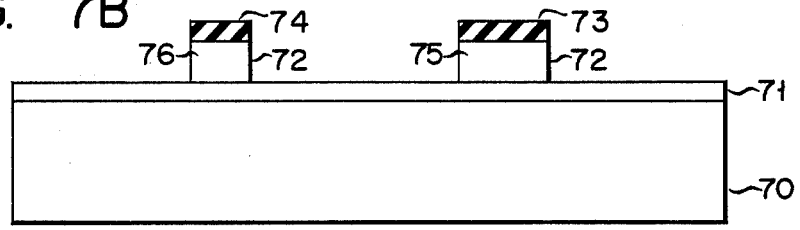

Then, an etchant consisting of HCl and $H_3PO_4$, mixed at a ratio of 1:1, was applied for the selective etching of the InP layer 72, as shown in FIG. 7B. As a result, an InP mask 75 consisting of the InP layer 72 was provided under the striped mask 73, and InP masks 76 consisting of the InP layer 72, was formed under the striped masks 74.

Figure 7C:
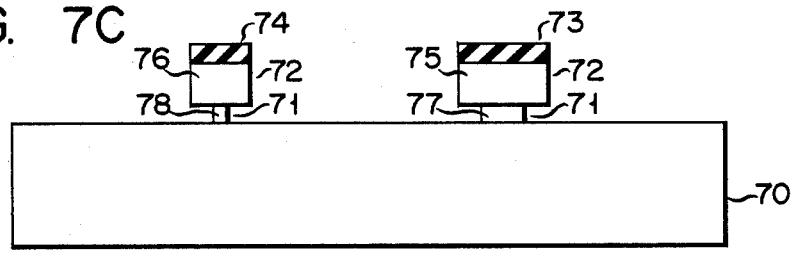

Thereafter, an etchant consisting of $H_2SO_4$, $H_2O_2$ and $H_2O$, mixed at a ratio of 4:1:1, was applied to etch the GaInAsp layer 71, as shown in FIG. 7C, with the aid of the striped masks 73, 74 and InP masks 75, 76. As a result, a main mesa stripe 77 and monitor mesa stripe 78 were formed. At this time, the width of the striped mask 73 differed from that of the striped masks 74 by the waist width $\Delta W$. Therefore, the width of the main mesa stripe 77 also differed from that of the monitor mesa stripes 78 by the waist width $\Delta W$.

Figure 7D:
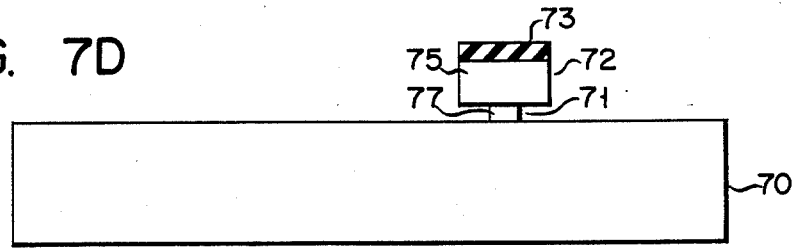

When etching is continued, the monitor mesa stripes 78 are brokes off, as seen in FIG. 7D. At this time the width of the main mesa stripe 77 accords substantially with the desired waist width $\Delta W$. After the striped mask 73 is removed from the mass shown in FIG. 7D, the side wall of the GaInAsP layer 71 is covered with the InP layer 72. The resultant mass is used in the manufacture of an embedded type semiconductor laser. Obviously, the second embodiment ensures the same effect as that of the first embodiment.

This invention is not limited to the foregoing embodiments. For instance, a semiconductor wafer used to provide the aforesaid main mesa stripe is not limited to a semiconductor compound composed of elements belonging to Groups III-V of the periodic table, but may be formed of a different semiconductor material. Further, it is possible to apply any type of etchant, provided it can etch a semiconductor crystal in the inverted mesa form. The type of etchant may be properly selected depending on the kind of a semiconductor crystal subjected to etching, and the prescribed crystal plane direction. Plural lines of monitor mesa stripes may be provided for the main mesa stripe, in place of a single line. In this case, it is possible to vary the position of the interval between the individual monitor mesa stripes with the respective lines thereof. Obviously, it is possible to apply this invention with various changes and modification without departing from the scope and object of the invention.

We claim:

1. A method of etching a semiconductor wafer to provide a mesa strip whose waist is narrower than the upper plane of said mesa stripe, by an mesa etching process, comprising the steps of:

forming a first striped mask in order to fabricate a main mesa stripe having a prescribed waist width on the semiconductor wafer;

providing a plurality of second striped masks on said semiconductor wafer plane before, after or at the same time as the foregoing step and in parallel with said first striped mask in order to fabricate monitor mesa stripes which are narrower than said first striped mask by the prescribed wasit width of the main mesa stripe, linearly arranging said plural second striped masks at prescribed intervals; and carrying out the mesa etching of the portions of said semiconductor wafer which are not covered by said first and second striped masks.

2. The method according to claim 1, wherein said linearly arranged second striped masks have a length more than twice the width of said second striped masks.

3. The method according to claim 1, wherein the interval between the respective linearly arranged second striped masks is defined to be longer than twice the depth of the etched portion of said semiconductor wafer.

4. The method according to claim 1, wherein the semiconductor wafer to be subjected to said mesa etching is prepared from a semiconductor compound consisting of elements belonging to Groups III-V of the periodic table, said first and second striped masks are prepared from $SiO_2$ or $Si_3N_4$, and an etchant solution is applied for said etching.

5. The method according to claim 4, wherein said semiconductor wafer is prepared from a compound of InP or GaAs and said etchant is prepared from a solution of Br methanol.

6. The method according to claim 1, wherein said semiconductor wafer subjected to mesa etching is prepared from a compound consisting of the elements belonging to Groups III-V of the periodic table, said first and second striped masks are made of semiconductor compound crystal having a composition different from that of said semiconductor compound crystal to be etched, and an etchant solution is applied for said etching.

7. The method according to claim 6, wherein a semiconductor crystal subjected to said mesa etching is prepared from a compound of GaInAsP, said semiconductor compound crystal applied as said mask consists of InP, and said etching solution is prepared from a mixture of $H_2SO_4$, $H_2O_2$ and $H_2O$.

* * * * *